(12) United States Patent
Choi et al.

(10) Patent No.: US 8,642,469 B2
(45) Date of Patent: Feb. 4, 2014

(54) SEMICONDUCTOR DEVICE AND METHOD OF FORMING MULTI-LAYERED UBM WITH INTERMEDIATE INSULATING BUFFER LAYER TO REDUCE STRESS FOR SEMICONDUCTOR WAFER

(75) Inventors: DaeSik Choi, Seoul (KR); JoonYoung Choi, Kyoung-ki-do (KR); Wonll Kwon, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 108 days.

(21) Appl. No.: 13/031,546

(22) Filed: Feb. 21, 2011

(65) Prior Publication Data
US 2012/0211900 A1 Aug. 23, 2012

(51) Int. Cl.
*H01L 21/44* (2006.01)
*H01L 21/00* (2006.01)

(52) U.S. Cl.
USPC ............... 438/666; 438/106; 438/126

(58) Field of Classification Search
USPC ............ 257/782, 734, 737, 738, E21.158, 257/E23.01; 438/106, 126, 127, 455, 654, 438/666, 652
See application file for complete search history.

(56) References Cited

U.S. PATENT DOCUMENTS

| | | | |
|---|---|---|---|
| 6,235,552 B1 * | 5/2001 | Kwon et al. .............. | 438/106 |
| 7,105,433 B2 | 9/2006 | Tsai et al. | |
| 7,187,078 B2 | 3/2007 | Lin et al. | |
| 7,473,998 B2 | 1/2009 | Tsai | |
| 7,501,311 B2 | 3/2009 | Tsai | |
| 7,666,779 B2 | 2/2010 | Ke et al. | |
| 2002/0185721 A1 * | 12/2002 | Hwang et al. .............. | 257/678 |
| 2005/0012211 A1 | 1/2005 | Kung et al. | |
| 2005/0090090 A1 | 4/2005 | Kim et al. | |
| 2006/0097392 A1 | 5/2006 | Wu | |
| 2006/0249844 A1 | 11/2006 | Yang | |
| 2007/0075423 A1 | 4/2007 | Ke et al. | |
| 2008/0169559 A1 | 7/2008 | Yang | |
| 2008/0197489 A1 | 8/2008 | Chyi | |
| 2009/0091036 A1 | 4/2009 | Chen et al. | |
| 2009/0189286 A1 | 7/2009 | Daubenspeck et al. | |
| 2010/0127401 A1 * | 5/2010 | Kim .......................... | 257/773 |
| 2011/0260316 A1 * | 10/2011 | Jang et al. .................. | 257/737 |

* cited by examiner

*Primary Examiner* — Walter H Swanson
*Assistant Examiner* — Wilner Jean Baptiste
(74) *Attorney, Agent, or Firm* — Robert D. Atkins; Patent Law Group: Atkins & Associates, P.C.

(57) ABSTRACT

A semiconductor wafer has a contact pad. A first insulating layer is formed over the wafer. A second insulating layer is formed over the first insulating layer and contact pad. A portion of the second insulating layer is removed to expose the contact pad. A first UBM layer is formed over and follows a contour of the second insulating layer and contact pad to create a well over the contact pad. A first buffer layer is formed in the well over the first UBM layer and the contact pad. A second UBM layer is formed over the first UBM layer and first buffer layer. A third UBM layer is formed over the second UBM layer. A bump is formed over the third UBM layer. The first buffer layer reduces stress on the bump and contact pad. A second buffer layer can be formed between the second and third UBM layers.

31 Claims, 8 Drawing Sheets

SEMICONDUCTOR DEVICE AND METHOD OF FORMING MULTI-LAYERED UBM WITH INTERMEDIATE INSULATING BUFFER LAYER TO REDUCE STRESS FOR SEMICONDUCTOR WAFER

FIELD OF THE INVENTION

The present invention relates in general to semiconductor devices and, more particularly, to a semiconductor device and method of forming a multi-layered UBM with an intermediate insulating buffer layer to reduce thermal and mechanical stress for a semiconductor wafer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Flipchip type semiconductor die often contain contact pads with UBM and bumps for electrical interconnect to other devices. The bumps and contact pads are subject to thermal and mechanical stress, particularly for fine pitch bumps on low dielectric constant (k) semiconductor wafers. The stress can cause bump cracking, delamination, and other interconnect defects, particularly during manufacturing and reliability testing. The thermal and mechanical stress decreases in production yield and increases manufacturing costs.

SUMMARY OF THE INVENTION

A need exists to reduce stress on the contact pads and bumps used for electrical interconnect in semiconductor die. Accordingly, in one embodiment, the present invention is a method of making a semiconductor device comprising the steps of providing a semiconductor wafer having a contact pad, forming a first insulating layer over the semiconductor wafer, forming a second insulating layer over the first insulating layer and contact pad, removing a portion of the second insulating layer to expose the contact pad, forming a first conductive layer over the second insulating layer and contact pad, forming a first buffer layer over the first conductive layer and contact pad, forming a second conductive layer over the first conductive layer and first buffer layer, forming a third conductive layer over the second conductive layer, and forming a bump over the third conductive layer. The second conductive layer is electrically connected to the first conductive layer, and the third conductive layer is electrically connected to the second conductive layer.

In another embodiment, the present invention is a method of making a semiconductor device comprising the steps of providing a semiconductor die having a contact pad, forming a first insulating layer over the semiconductor die, forming a first conductive layer over the first insulating layer and contact pad, forming a first buffer layer over the first conductive layer over the contact pad, forming a second conductive layer over the first conductive layer and first buffer layer, forming a third conductive layer over the second conductive layer, and forming an electrical interconnect over the third conductive layer.

In another embodiment, the present invention is a method of making a semiconductor device comprising the steps of providing a semiconductor die having a contact pad, forming a first insulating layer over the semiconductor die, forming a first conductive layer over the first insulating layer and contact pad, forming a first buffer layer over the first conductive layer over the contact pad, forming a second conductive layer over the first conductive layer and first buffer layer, and forming an electrical interconnect over the second conductive layer.

In another embodiment, the present invention is a semiconductor device comprising a semiconductor die having a contact pad. A first insulating layer is disposed over the semiconductor die. A first conductive layer is disposed over the first insulating layer and contact pad. A first buffer layer is disposed over the first conductive layer over the contact pad. A second conductive layer is disposed over the first conductive layer and first buffer layer. An electrical interconnect is disposed over the second conductive layer.

DETAILED DESCRIPTION OF THE DRAWINGS

Figure 1:
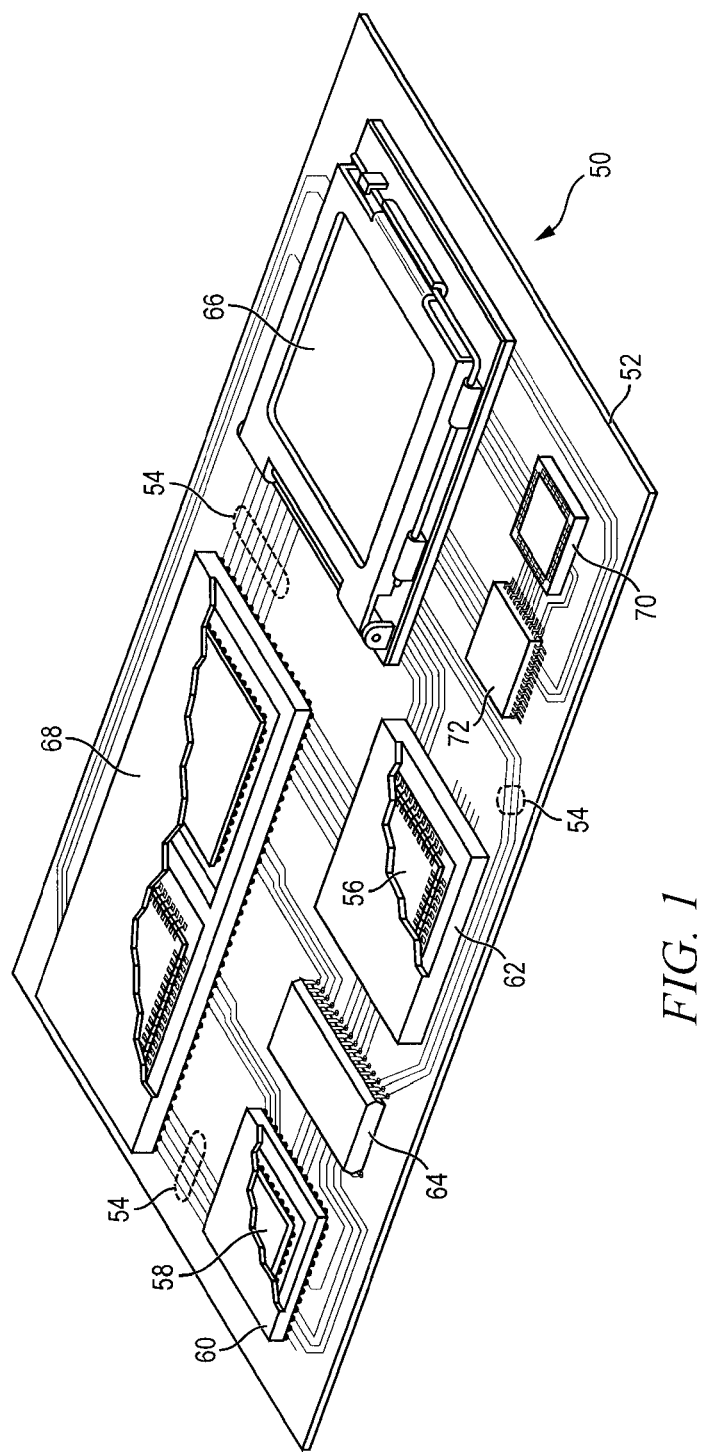
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
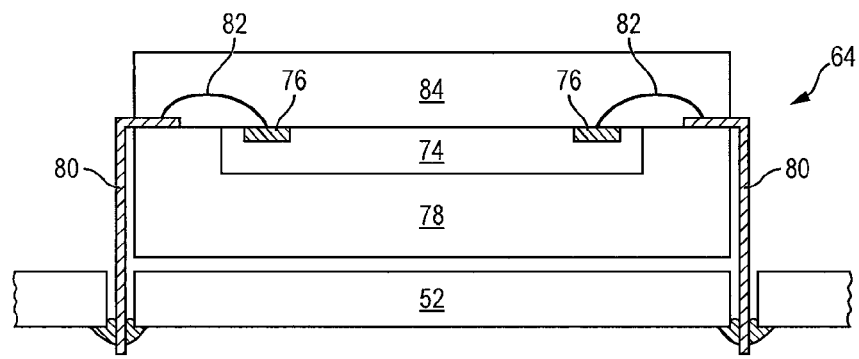
FIGS. 2a-2c illustrate further detail of the representative semiconductor packages mounted to the PCB.
Figure 2B:
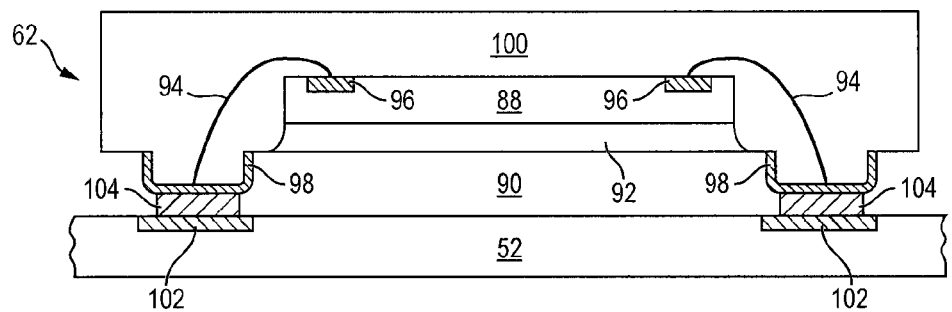
Figure 2C:
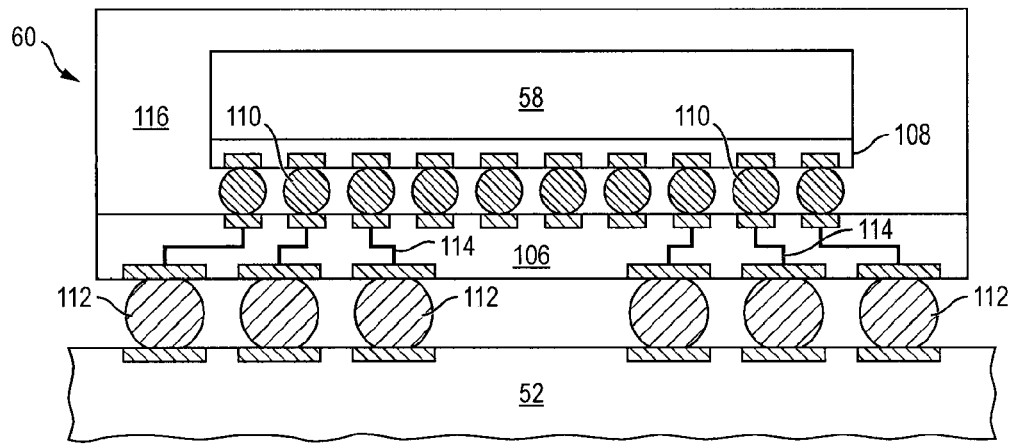

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
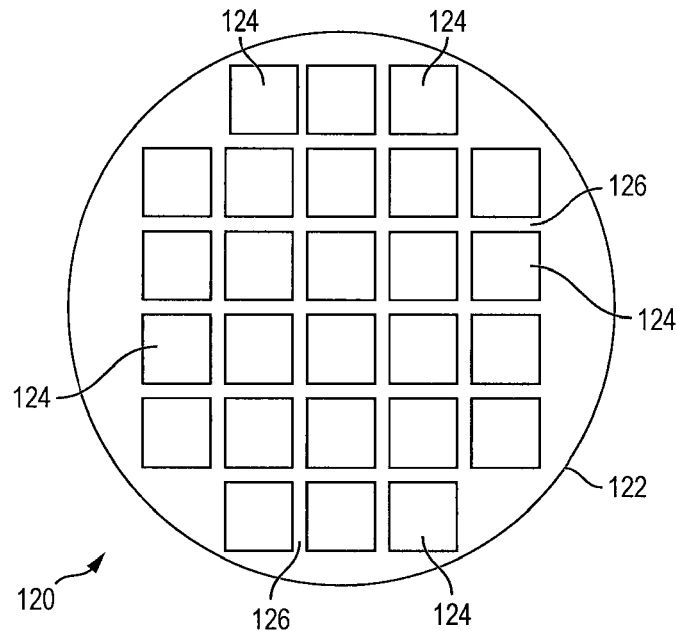
FIGS. 3a-3o illustrate a process of forming a multi-layered UBM with an intermediate insulating buffer layer to reduce stress for a semiconductor wafer.
Figure 3B:
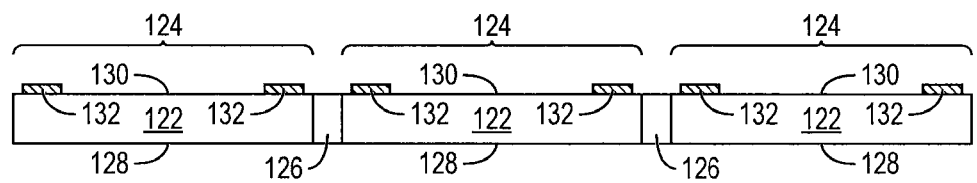
Figure 3C:
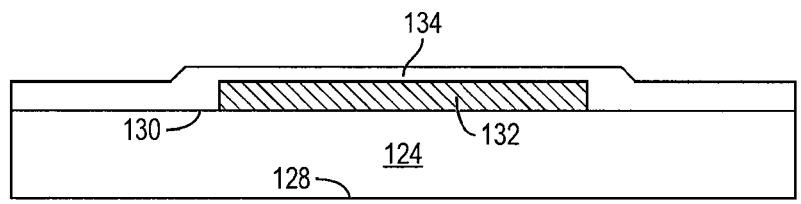
Figure 3D:
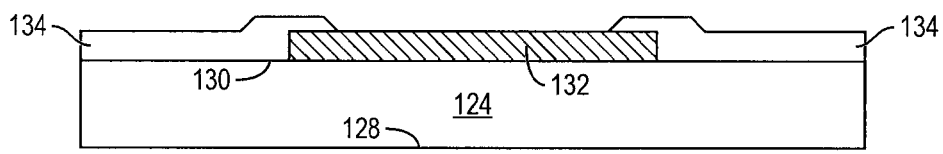
Figure 3E:
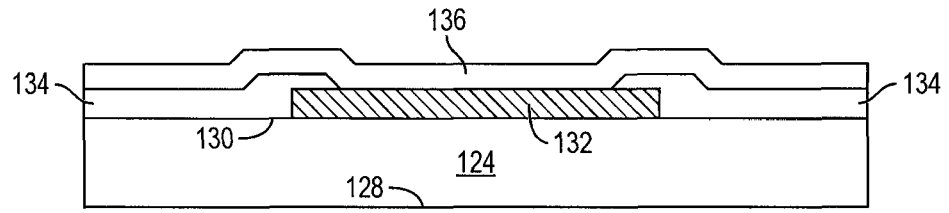
Figure 3F:
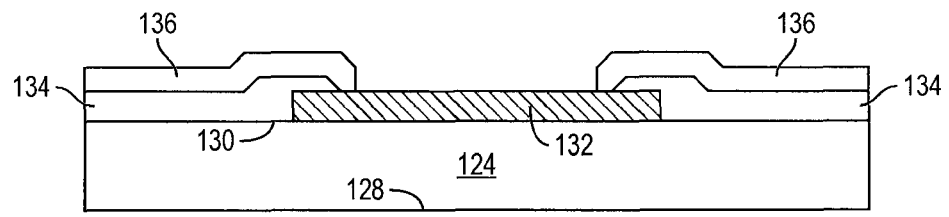
Figure 3G:
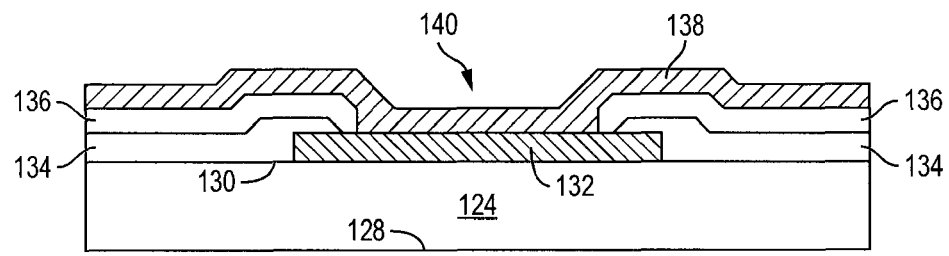
Figure 3H:
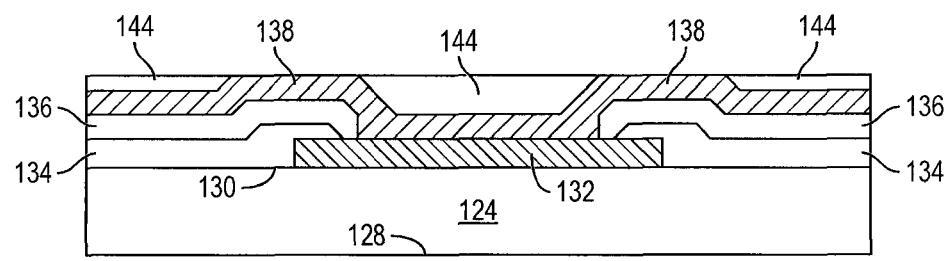
Figure 3I:
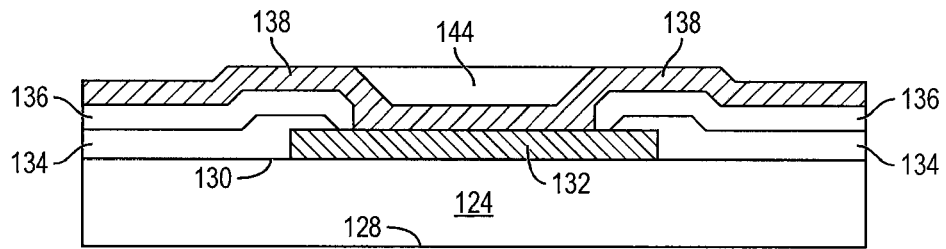
Figure 3J:
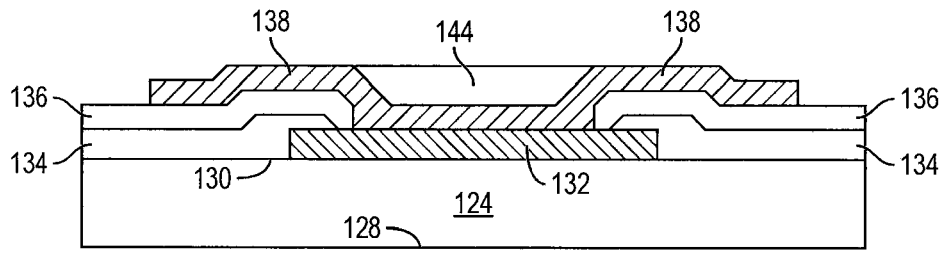
Figure 3K:
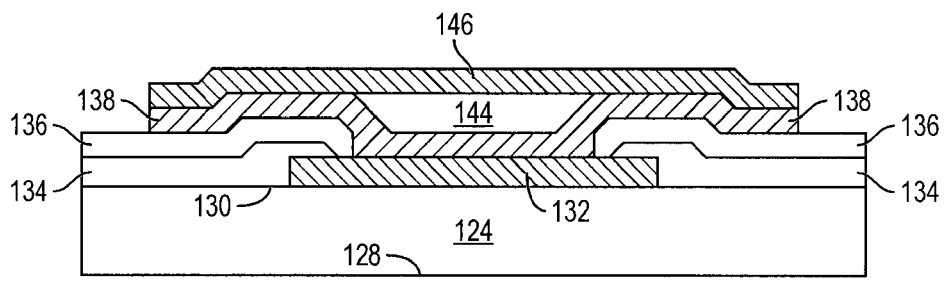
Figure 3L:
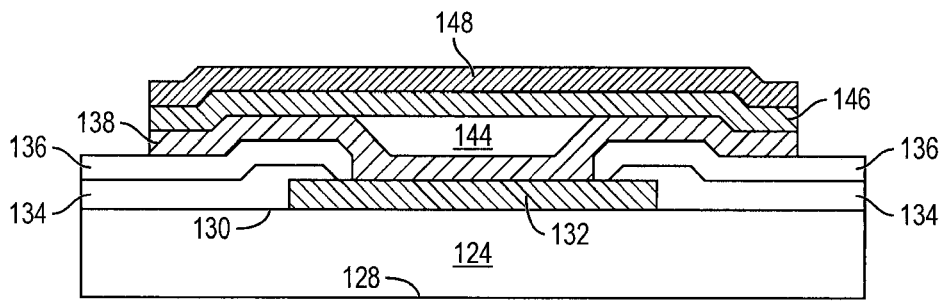
Figure 3M:
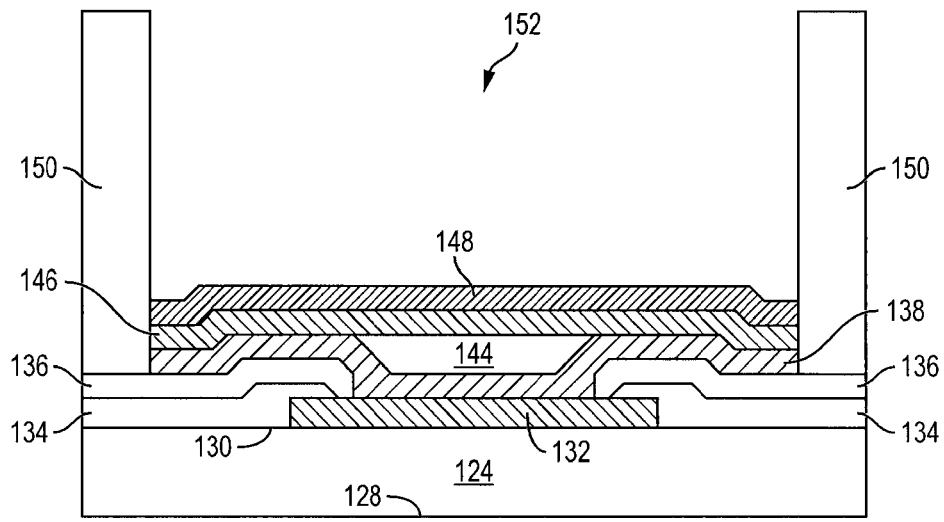
Figure 3N:
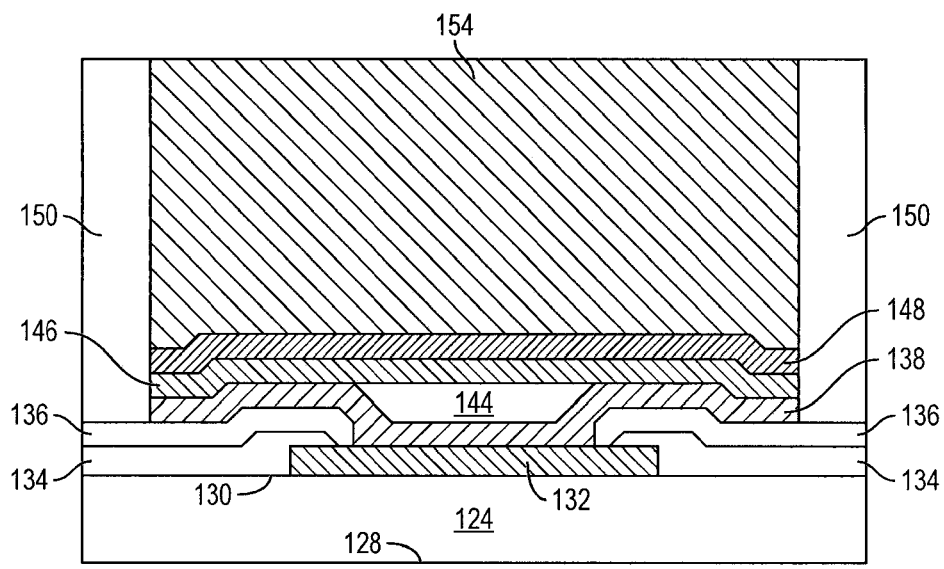
Figure 3O:
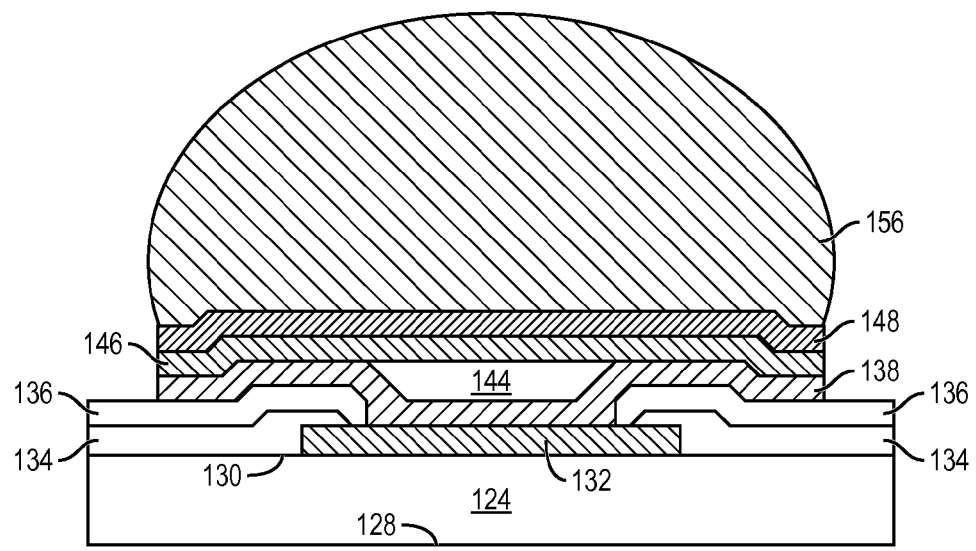

FIGS. 3a-3o illustrate, in relation to FIGS. 1 and 2a-2c, a process of forming a multi-layered UBM with an intermediate insulating buffer layer to reduce thermal and mechanical stress for a semiconductor wafer. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit.

Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads are disposed a first distance from the edge of the die, and a second row of contact pads alternating with the first row are disposed a second distance from the edge of the die.

FIG. 3c shows a portion of semiconductor wafer 120 associated with a single contact pad 132. An insulating or passivation layer 134 is formed over active surface 130 and conductive layer 132 using PVD, CVD, printing, spin coating, spray coating, lamination, or thermal oxidation. The insulating layer 134 can be one or more layers of silicon dioxide (SiO2), silicon nitride (Si3N4), silicon oxynitride (SiON), tantalum pentoxide (Ta2O5), aluminum oxide (Al2O3), or other suitable material with similar insulating and structural properties. In FIG. 3d, a portion of insulating layer 134 is removed by an etching process to overlap and expose conductive layer 132.

In FIG. 3e, an insulating buffer layer 136 is conformally applied over insulating layer 134 and the exposed conductive layer 132 using PVD, CVD, printing, spin coating, spray coating, lamination, or thermal oxidation. The insulating layer 136 contains one or more layers of polyimide, benzocyclobutene (BCB), polybenzoxazoles (PBO), SiO2, Si3N4, SiON, Ta2O5, Al2O3, or other suitable dielectric material. The insulating layer 136 follows the contour of conductive layer 132 and insulating layer 134. In FIG. 3f, a portion of insulating layer 136 is removed by an etching process to overlap insulating layer 134 and expose conductive layer 132.

In FIG. 3g, an electrically conductive layer 138 is conformally applied over insulating layer 136 and the exposed conductive layer 132 using a patterning and metal deposition process such as PVD, CVD, sputtering, electrolytic plating, and electroless plating. Conductive layer 138 can be one or more layers of Al, Cu, Sn, Ni, Au, Ag, or other suitable electrically conductive material. Conductive layer 138 follows the contour of insulating layer 136 and the exposed conductive layer 132 to form a well 140 over the contact pad. Conductive layer 138 operates as an under bump metallization (UBM) layer electrically connected to conductive layer 132.

In FIG. 3h, an insulating buffer layer 144 is formed over conductive layer 138, including into well 140, using PVD, CVD, printing, spin coating, spray coating, lamination, or thermal oxidation. The insulating buffer layer 144 contains one or more layers of polyimide, BCB, PBO, SiO2, Si3N4, SiON, Ta2O5, Al2O3, or other suitable dielectric material. In FIG. 3i, a portion of insulating buffer layer 144 is removed by an etching process to expose conductive layer 138, while leaving insulating buffer layer 144 within well 140 over conductive layer 132. In FIG. 3j, a portion of conductive layer 138 is removed by an etching process to expose insulating layer 136 on both sides of conductive layer 132.

In FIG. 3k, an electrically conductive layer 146 is conformally applied over conductive layer 138 and insulating buffer layer 144 using a patterning and metal deposition process such as PVD, CVD, sputtering, electrolytic plating, and electroless plating. Conductive layer 146 can be one or more layers of Al, Cu, Sn, Ni, Au, Ag, or other suitable electrically conductive material. Conductive layer 146 follows the contour of conductive layer 138 and insulating buffer layer 144. Conductive layer 146 operates as a UBM layer electrically connected to conductive layer 138.

In FIG. 3l, an electrically conductive layer 148 is conformally applied over conductive layer 146 using a patterning and metal deposition process such as PVD, CVD, sputtering, electrolytic plating, and electroless plating. Conductive layer 148 can be one or more layers of Al, Cu, Sn, Ni, Au, Ag, or other suitable electrically conductive material. Conductive layer 148 follows the contour of conductive layer 146. Conductive layer 148 operates as a UBM layer electrically connected to conductive layer 146.

In FIG. 3m, a photoresist layer 150 is deposited over semiconductor wafer 120. A portion of photoresist layer 150 is removed to form opening 152 and expose conductive layer 148.

In FIG. 3n, an electrically conductive bump material 154 is deposited over conductive layer 148 within opening 152 using an evaporation, electrolytic plating, electroless plating, ball drop, or screen printing process. Bump material 154 can be Al, Sn, Ni, Au, Ag, Pb, Bi, Cu, solder, and combinations thereof, with an optional flux solution. For example, bump material 154 can be eutectic Sn/Pb, high-lead solder, or lead-free solder. Bump material 154 is bonded to conductive layer 148 using a suitable attachment or bonding process. In one embodiment, bump material 154 is reflowed by heating the material above its melting point to form spherical balls or bumps 156. In some applications, bumps 156 are reflowed a second time to improve electrical contact to conductive layer 148. The bumps can also be compression bonded to conductive layer 148. Photoresist layer 150 is removed by an etching process, leaving bump 156, as shown in FIG. 3o. Bumps 156 represent one type of interconnect structure that can be formed over conductive layer 148. The interconnect structure can also use stud bump, micro bump, or other electrical interconnect.

The UBM structure includes conductive layers 138 as an adhesion layer, conductive layer 146 as a seed layer, and conductive layer 148 as a wetting and barrier layer. The adhesion layer 138 is formed over insulating layer 136 and conductive layer 132 and can be titanium (Ti), titanium nitride (TiN), titanium tungsten (TiW), Al, or chromium (Cr). The seed layer 146 is formed over the adhesion layer and can be Cu, Ni, NiV, Au, or Al. The wetting and barrier layer 148 is formed over the seed layer 146 and can be Ni, NiV, platinum (Pt), palladium (Pd), TiW, or chromium copper (CrCu). The barrier layer 148 inhibits the diffusion of Cu into the active area of the die. The insulating buffer layer 136 blocks bump material 154 from reaching insulating layer 134.

The UBM conductive layers 138, 146, and 148 with intermediate insulating buffer layer 144 disposed between the stacked conductive layers distributes and reduces thermal and mechanical stress on bump 156 and contact pad 132. The stress relief is particularly useful for fine pitch bumps on low-k semiconductor wafers. The stacked UBM/buffer structure 138-148 decreases bump cracking, delamination, and other interconnect defects, particularly during manufacturing and reliability testing, and increases production yield which lowers manufacturing costs.

Figure 4:
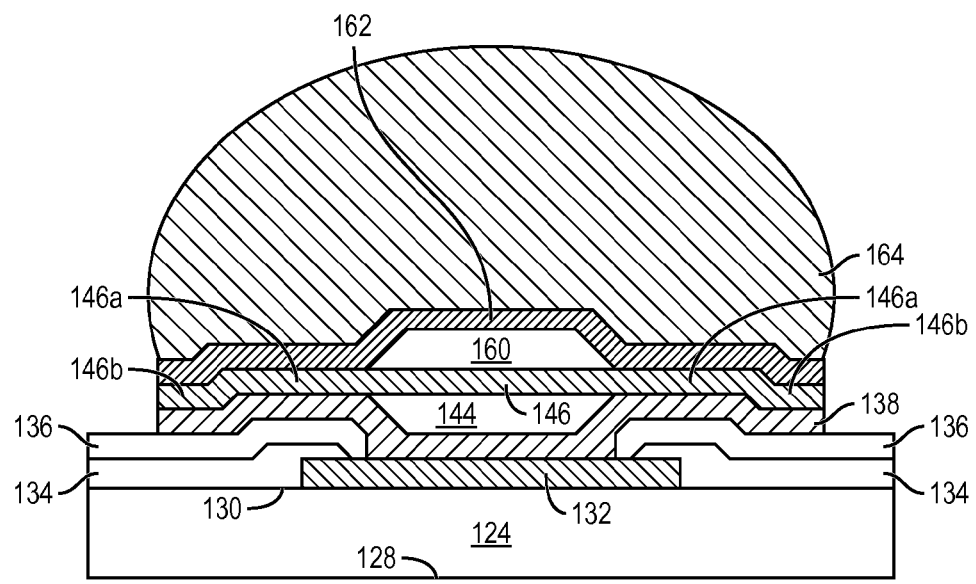
FIG. 4 illustrates the multi-layered UBM with multiple intermediate insulating buffer layers.

FIG. 4 shows another embodiment, continuing from FIG. 3k, with an insulating buffer layer 160 formed over conductive layer 146 using PVD, CVD, printing, spin coating, spray coating, lamination, or thermal oxidation. The insulating buffer layer 160 contains one or more layers of polyimide, BCB, PBO, SiO2, Si3N4, SiON, Ta2O5, Al2O3, or other suitable dielectric material. A portion of insulating buffer layer 160 is removed by an etching process to expose outer portions 146a and 146b of conductive layer 146, while leaving insulating buffer layer 160 centrally located over a portion of conductive layer 146 directly above conductive layer 138 and insulating buffer layer 144.

An electrically conductive layer 162 is conformally applied over conductive layer 146 and insulating buffer layer 160 using a patterning and metal deposition process such as PVD, CVD, sputtering, electrolytic plating, and electroless plating. Conductive layer 162 can be one or more layers of Al, Cu, Sn, Ni, Au, Ag, or other suitable electrically conductive material. Conductive layer 162 follows the contour of conductive layer 146 and insulating buffer layer 160. Conductive layer 162 operates as a UBM layer electrically connected to conductive layer 146.

A photoresist layer is deposited over semiconductor wafer 120. A portion of photoresist layer is removed to form an opening and expose conductive layer 162.

An electrically conductive bump material is deposited over conductive layer 162 within the opening of the photoresist layer using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or bumps 164. In some applications, bumps 164 are reflowed a second time to improve electrical contact to conductive layer 162. The bumps can also be compression bonded to conductive layer 162. The photoresist layer is removed by an etching process, leaving bump 164. Bumps 164 represent one type of interconnect structure that can be formed over conductive layer 162. The interconnect structure can also use stud bump, micro bump, or other electrical interconnect.

The UBM structure includes conductive layers 138 as an adhesion layer, conductive layer 146 as a seed layer, and conductive layer 162 as a wetting and barrier layer. The insulating layer 136 blocks the bump material from reaching insulating layer 134.

The UBM conductive layers 138, 146, and 162 with intermediate insulating buffer layers 144 and 160 disposed between the stacked conductive layers distribute and reduce thermal and mechanical stress on bump 164 and contact pad 132. The stress relief is particularly useful for fine pitch bumps on low-k semiconductor wafers. The stacked UBM/buffer structure 138, 146, and 162 decreases bump cracking, delamination, and other interconnect defects, particularly during manufacturing and reliability testing, and increases production yield which lowers manufacturing costs.

Figure 5:
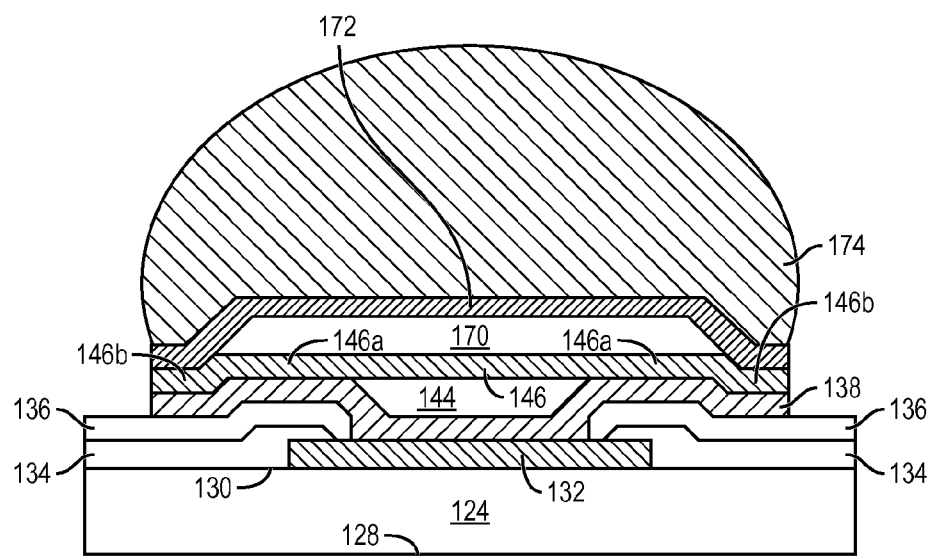
FIG. 5 illustrates another multi-layered UBM with multiple intermediate insulating buffer layers.

FIG. 5 shows another embodiment, continuing from FIG. 3k, with an insulating buffer layer 170 formed over conductive layer 146 using PVD, CVD, printing, spin coating, spray coating, lamination, or thermal oxidation. The insulating buffer layer 170 contains one or more layers of polyimide, BCB, PBO, SiO2, Si3N4, SiON, Ta2O5, Al2O3, or other suitable dielectric material. A portion of insulating buffer layer 170 is removed by an etching process to expose an outer stepped portion 146b of conductive layer 146, while leaving insulating buffer layer 170 over flat portion 146a of conductive layer 146, conductive layer 132, and insulating buffer layer 144.

An electrically conductive layer 172 is conformally applied over conductive layer 146 and insulating buffer layer 170 using a patterning and metal deposition process such as PVD, CVD, sputtering, electrolytic plating, and electroless plating. Conductive layer 172 can be one or more layers of Al, Cu, Sn, Ni, Au, Ag, or other suitable electrically conductive material. Conductive layer 172 follows the contour of conductive layer 146 and insulating buffer layer 170. Conductive layer 172 operates as a UBM layer electrically connected to conductive layer 146.

A photoresist layer is deposited over semiconductor wafer 120. A portion of photoresist layer is removed to form an opening and expose conductive layer 172.

An electrically conductive bump material is deposited over conductive layer 172 within the opening of the photoresist layer using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form spherical balls or bumps 174. In some applications, bumps 174 are reflowed a second time to improve electrical contact to conductive layer 172. The bumps can also be compression bonded to conductive layer 172. The photoresist layer is removed by an etching process, leaving bump 174. Bumps 174 represent one type of interconnect structure that can be formed over conductive layer 172. The interconnect structure can also use stud bump, micro bump, or other electrical interconnect.

The UBM structure includes conductive layers 138 as an adhesion layer, conductive layer 146 as a seed layer, and conductive layer 172 as a wetting and barrier layer. The insulating layer 136 blocks the bump material from reaching insulating layer 134.

The UBM conductive layers 138, 146, and 172 with intermediate insulating buffer layers 144 and 170 disposed between the stacked conductive layers distribute and reduce thermal and mechanical stress on bump 174 and contact pad 132. The stress relief is particularly useful for fine pitch bumps on low-k semiconductor wafers. The stacked UBM/buffer structure 138, 146, and 172 decreases bump cracking, delamination, and other interconnect defects, particularly during manufacturing and reliability testing, and increases production yield which lowers manufacturing costs.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer including a contact pad;
    forming a first conductive layer over the contact pad;
    forming a first buffer layer over the first conductive layer and the contact pad;
    forming a second conductive layer over the first conductive layer and first buffer layer with a first surface of the first buffer layer disposed over the first conductive layer and the second conductive layer disposed over a second surface of the first buffer layer opposite the first surface of the first buffer layer and the second conductive layer electrically connected to the first conductive layer; and forming a bump over the second conductive layer.

2. The method of claim 1, wherein the first buffer layer reduces stress on the bump and contact pad.

3. The method of claim 1, further including:
forming a first insulating layer over the semiconductor wafer;
forming the first conductive layer to follow a contour of the first insulating layer and the contact pad to create a well over the contact pad; and
forming the first buffer layer in the well over the contact pad.

4. The method of claim 1, further including forming a second buffer layer over the second conductive layer.

5. The method of claim 1, further including forming a third conductive layer over the second conductive layer and electrically connected to the second conductive layer.

6. The method of claim 5, wherein forming the bump includes:
forming a photoresist layer over the third conductive layer;
removing a portion of the photoresist layer to expose the third conductive layer;
depositing a bump material over the third conductive layer; and
reflowing the bump material to form the bump.

7. The method of claim 5, wherein the first, second, and third conductive layer are stacked under a bump metallization layers.

8. A method of making a semiconductor device, comprising:
providing a semiconductor die including a contact pad;
forming a first conductive layer over the contact pad;
forming a first buffer layer over the first conductive layer and the contact pad;
forming a second conductive layer over the first conductive layer and the first buffer layer with the first buffer layer disposed between first conductive layer and second conductive layer; and
forming an electrical interconnect over the second conductive layer.

9. The method of claim 8, further including:
forming a first insulating layer over the semiconductor die; and
forming a second insulating layer over the first insulating layer and contact pad.

10. The method of claim 8, wherein the electrical interconnect includes a bump.

11. The method of claim 8, wherein the first buffer layer reduces stress on the electrical interconnect and the contact pad.

12. The method of claim 8, further including:
forming a first insulating layer over the semiconductor die;
forming the first conductive layer to follow a contour of the first insulating layer and contact pad to create a well over the contact pad; and
forming the first buffer layer in the well over the contact pad.

13. The method of claim 8, further including forming a second buffer layer over the second conductive layer.

14. The method of claim 8, further including forming a third conductive layer over the second conductive layer and electrically connected to the second conductive layer.

15. The method of claim 14, wherein forming the electrical interconnect includes:
forming a photoresist layer over the third conductive layer;
removing a portion of the photoresist layer to expose the third conductive layer;
depositing a bump material over the third conductive layer; and
reflowing the bump material to form the electrical interconnect.

16. A method of making a semiconductor device, comprising:
providing a semiconductor die including a contact pad;
forming a first conductive layer over the contact pad;
forming a second conductive layer over the first conductive layer;
forming a third conductive layer over the second conductive layer;
forming a first buffer layer between the first conductive layer and third conductive layer; and
forming an electrical interconnect over the third conductive layer.

17. The method of claim 16, wherein the first, second, and third conductive layer are stacked under a bump metallization layers.

18. The method of claim 16, further including forming a second buffer layer over the second conductive layer prior to forming the third conductive layer.

19. The method of claim 16, further including:
forming a first insulating layer over the semiconductor die; and
forming a second insulating layer over the first insulating layer and contact pad.

20. The method of claim 16, wherein the first buffer layer reduces stress on the electrical interconnect and the contact pad.

21. The method of claim 16, further including:
forming a first insulating layer over the semiconductor die;
forming the first conductive layer to follow a contour of the first insulating layer and the contact pad to create a well over the contact pad; and
forming the first buffer layer in the well over the contact pad.

22. A method of making a semiconductor device, comprising:
providing a semiconductor die including a contact pad;
forming a plurality of stacked conductive layers including a seed layer, an adhesion layer, and a wetting layer over the contact pad; and
forming a first buffer layer between the plurality of stacked conductive layers, wherein the first buffer layer is formed within a well over one of the plurality of stacked conductive layers.

23. The method of claim 22, further including forming a second buffer layer between the plurality of stacked conductive layers.

24. The method of claim 22, further including forming a first insulating layer over the semiconductor die.

25. The method of claim 22, further including forming a second insulating layer over the first insulating layer.

26. The method of claim 22, further including depositing a bump material over the plurality of stacked conductive layers.

27. A method of making a semiconductor device, comprising:
providing a semiconductor die;
forming a first conductive layer over the semiconductor die;
forming a first buffer layer over the first conductive layer;
forming a second conductive layer over the first conductive layer and first buffer layer with the first buffer layer disposed between first conductive layer and second conductive layer and the second conductive layer electrically connected to the first conductive layer; and forming an interconnect structure over the second conductive layer.

28. The method of claim 27, further including:

forming a first insulating layer over the semiconductor die; and forming a second insulating layer over the first insulating layer.

29. The method of claim 27, wherein the interconnect structure includes a bump.

30. The method of claim 27, further including forming a second buffer layer over the second conductive layer.

31. The method of claim 30, further including forming a third conductive layer over the second conductive layer and second buffer layer and electrically connected to the second conductive layer.

* * * * *